United States Patent [19]

Frazier

[11] Patent Number: 5,293,453

[45] Date of Patent: Mar. 8, 1994

[54] ERROR CONTROL CODEWORD GENERATING SYSTEM AND METHOD BASED ON A NEURAL NETWORK

[75] Inventor: Gary A. Frazier, Garland, Tex.

[73] Assignee: Texas Instruments Incorporated, Dallas, Tex.

[21] Appl. No.: 836,186

[22] Filed: Feb. 13, 1992

Related U.S. Application Data

[63] Continuation of Ser. No. 534,806, Jun. 7, 1990, abandoned.

[51] Int. Cl.$^5$ .................... H03M 7/00; G06F 15/18
[52] U.S. Cl. ........................................ 395/22; 341/51
[58] Field of Search ................................. 395/21, 22

[56] References Cited

U.S. PATENT DOCUMENTS

| | | | |
|---|---|---|---|
| 4,829,526 | 5/1989 | Clark et al. | 371/40 |
| 4,855,742 | 8/1989 | Verboom | 341/102 |
| 4,864,303 | 9/1989 | Ofek | 341/95 |
| 4,928,310 | 5/1990 | Goutzoulis et al. | 380/46 |
| 4,945,494 | 7/1990 | Penz et al. | 364/513 |
| 4,954,963 | 9/1990 | Penz et al. | 364/513 |
| 4,972,187 | 11/1990 | Wecker | 341/96 |
| 4,972,473 | 11/1990 | Ejiri et al. | 380/20 |
| 4,979,185 | 12/1990 | Bryans et al. | 375/20 |
| 4,993,046 | 2/1991 | Saito et al. | 375/39 |
| 5,053,974 | 10/1991 | Penz | 364/513 |
| 5,134,396 | 7/1992 | Sirat et al. | 341/51 |

OTHER PUBLICATIONS

Hopfield, J. J., "Neural networks and physical systems with emergent collective computational abilities", Proc. National Academy of Science, Apr. 1982, 2334–2338.
Lippmann, R. P., "An Introduction to Computing with Neural Nets", IEEE ASSP Magazine, Apr. 1987, 4–22.
Baram, Y., "Nested Neural Networks and Their Codes", from 1990 IEEE Intl. Symp. on Information Theory, Jan. 1990, p. 9.

Primary Examiner—Michael R. Fleming
Assistant Examiner—Robert W. Downs
Attorney, Agent, or Firm—Carlton H. Hoel; Richard A. Stoltz; Richard L. Donaldson

[57] ABSTRACT

A communication system and method that translates a first plurality of information symbols into a plurality of code words, transmits the plurality of code words through a communication channel receives the plurality of code words transmitted through the communication channel, deciphers the plurality of code words transmitted through the communication channel into a second plurality of information symbols that correspond to the first set plurality of information symbols, wherein the plurality of code words are derived from a reverse dynamical flow within a first neural network.

4 Claims, 10 Drawing Sheets

ERROR CONTROL CODEWORD GENERATING SYSTEM AND METHOD BASED ON A NEURAL NETWORK

This application is a continuation of application Ser. No. 07/534,806, filed Jun. 7, 1990, now abandoned.

CROSS-REFERENCE TO RELATED APPLICATIONS

Copending U.S. application Ser. Nos. 032,887, filed Mar. 31, 1987 (Penz) and 010,619, filed Feb. 4, 1987 (Frazier); and U.S. Pat. No. 4,885,757, issued Dec. 5, 1989; disclose related subject matter. All of these cross-referenced applications are assigned to the assignee of this application.

BACKGROUND OF THE INVENTION

1. Field of the Invention

The present invention relates to error control coding systems and methods, and, more particularly, including the generation and decoding of pseudo-random code word messages such as would be useful for increasing the reliability of tranferring information over noisy communication channels.

2. Description of the Related Art

Thermodynamics teaches that statistical fluctuations in the energy of media and systems cause a positive probability of errors being introduced in the process of transferring information from one point to another point. Information must be assembled, codified by symbols, encoded for transmission, converted into a physical signal, transported across a distance, received, decoded, and passed on to a user. At any stage in an electronic version of a communication process, transient errors due to temperature, cosmic rays, communication medium noise, receiver noise figure, and faulty apparatus and their components may occur. Noise in received signals, rather than apparatus failure, constitutes the primary factor limiting the performance of modern communication systems. Noise prevents the receiver(-demodulator) from distinguishing one message(-waveform) from another, thereby introducing uncertainties about the true nature of the information being received. It is therefore a problem to communicate reliably information in the presence of masking noise.

When the transmission of message information is accompanied by errors, the receiver of the information must perform operations that correct the errors so that an uncorrupted message can be presented to the user. for the correction process to be successful, it must be the case that not all possible received messages can be treated as valid, for othterwise the receiver would be incapable of distinguishing a valid message M1, from a corrupted valid message M2 wherein the corruption of M2 produced an apparent message identical to M1. Thus, the ability of a receiver to correct for errors introduced during transmission implies that redundant information must be added to valid messages so that the receiver can detect and possibly correct at least some errors. The added redundancy effectively lowers the rate at which useful message information can be transferred so that it is an advantage of error correction methods to be as efficient as possible without sacrificing error correcting ability.

Two primary methods currently exist for minimizing the impact of errors in electronic communication. In the first method, the energy per unit of information transferred is increased to the point where the raw signal to noise ratio exceeds the minimum value required for a tolerable rate of error production. In the second method error-control encoding techniques are used to add extra units of information the the message so that a receiver can detect and correct errors that occur at some maximum rate. Cost savings through the use of low-energy error control methods can be significant relative to the first method, even though an added complexity to the transmitter and receiver apparatii is required. The second error control method is the most widely used for the transfer and storage of digital information.

It is well known to encode the intelligence of information and transmit the encoded information to the receiver. Encoding normally adds redundant information to the message so that the receiver can detect, and in many cases correct, faulty received information. Simple error detectors and correcters are conventionally available for correcting minor errors. However, where the encoded message accumulates more than a couple of errors, such equipment is ineffective to correct errors.

In recent decades, much of the art in the field of error-control coding has addressed two essential problems; that of finding classes of code words that yield good error-control performance at various lengths, and then designing fast and cost effective circuitry to carry out the electronic control of errors.

In practice, a message to be transmitted by electronic means is encoded into a potentially long sequence of information symbols called bits by an error-control circuit, and then into a transmitted modulated waveform. A demodulation of this waveform at the receiver provides a sequence of bits to the error-control circuitry which uses the code word bits to make the best estimate of the message that was originally encoded.

One widely used method of makin gaccurate valid message ideification is to associate each of the possible information units in a message with a unique code word designed to facilitate the detection and correction of message transmission errors. In binary error-control coding, the error-control circuitry accepts information bits at a rate Rs, adds the desired level of redundancy, and then generates code word bits at a higher rate Rc. In a block encoder, successive k-bit blocks of binary information are converted into successive n-bit blocks where $n \geq k$. The n-bit block is referred interchangibly to as the code word, or code block, or block code word. When encoding using a convolution code, the encoder accepts information as a continuous stream of bits, and generates a continuous stream of output code bits at a higher rate. The number of information bits used by the encoder in generating each output code bit is called the constraint length of the code.

Examples of often employed block codes include the parity check codes, product codes, binary repetition codes, binary hamming codes. Most of the successful block codes are called cyclic codes such as the Bose-Chaudhuri-Hocquenghem codes because their well defined algebraic structure makes practical the contruction of low cost encoders and decoders using straighforward electronic means. However, all of these codes an all convolution codes suffer from an inability to correct errors when the error rate is very high in relation the message transmission rate. Good codes and circuitry exists for controlling small numbers of errors per code word received, but none of these conventional approaches have solved the problem of detecting and correcting errors when the probability of an error in a code word bit position is above a few percent. It is therefore a problem in the prior art to provide a method for correcting high rates of communication errors in a practical manner.

The Channel Coding Theorem first proven by Shannon states that every channel of communication has a channel capacity C, and that for any information transfer rate R<C there exists code words of block length n that can be transferred at rate R such that the probability of incorrectly interpreting a message, P(E), is bounded by $$P(E) \leq 2^{-nEb(R)}$$

where Eb(R) is positive and is determined the physical and noise properties of the channel. This theorem implies that for any symbol transmission rate less than C, it is possible to reduce the probability of miscorrecting the errors in a noisy message to any degree required, even if the error rate is very high. In practice the symbol transmission rate is held fixed while the length of the encoded message (code word) is increased in length. The lower error rate is thus offset by the need to add more and more redundant symbols to the basic message to provide the information needed to correct errors, but there is no reason in principle that prevents the correction of arbitrarily high error rates. This result is valid for both fixed length, Block codes, and fixed constraint length, Convolution codes.

It is important to observe that very noisy channels require the use of very long code words, even for very simple messages. For example, even though each of the 26 letters of the english alphabet may be represented by a unique sequence of 5 binary (zeros and ones) bits, successful communication of a sequence of such characters over a noisy channel may require the encoding, transmission, reception and decoding of code words of tens or even hundreds of bits in length per character transferred.

Unfortunately, no general theory exists which specifies the construction of code words for very noisy communication channels. Moreover, as the length of code words increase, the burden and complexity of the encoder and decoder circuitry is also increased at least proportionately. It is in general quite difficult to construct efficient encoders and decoders of long code words using conventional methods, even if the expected error rates are small.

However, Shannon's main theorem of information theory proves that it is possible to signal reliably through the use of random encodings of message symbols. Consider the encoding of information using randomly selected binary code words of n bits in length. There are $2^n$ such code words that can be selected, but if it is desired to guard against a large number of simultaneous errors in the communication process, then the admissible code words must be chosen to be very dissimilar so that they can be easily distinguished even when masked by noise. For binary code words, a measure of this similarity is called the "Hamming Distance." The hamming distance between any pair of code words of the same length is simply the total number of bit positions in which the code words are dissimilar. For example, the two code words, (101100) and (001110) have a Hamming distance between them of 2.

Code words consisting of long, random strings of zeros and ones symbols may be associated with valid messages. And because such bit strings are random and thus nearly uncorrelated (orthogonal), these special code words give the receiver the best chance of recovering from high levels of added noise.

One method of selecting a set of random code words for error-control encoding is to select each word by random coin tossing. That is, each bit in each code word is obtained by flipping an unbiased coin until all code words have been generated. The set of code words are then shared between the sender and receiver so that the sender and receiver share an identical table that associates a unique message symbol with a unique code word.

We can imagine the code words as points in an n-dimensional space of possible code words. We assume that the minimum Hamming distance between any pair of code words in the code word set is at least $D_{min}$. By the law of large numbers there is, for a sufficiently large code word size n, an arbitrarily small probability that the received message will lie at or beyond a Hamming distance $(D_{min}-1)/2$ from one of the uncorrupted code words as long as $$D_{min} > 2ne + 1,$$

where e is the probability of a random error at any bit position in the received message. Thus, if the receiver-decoder assumes that the codeword that is most similar to the received code word is in fact the actual code word sent, then up to ne errors in the received word can be corrected with high probability.

The method of using randomly selected code words to encode information to be sent over noisy channels seems attractive and easily implementable due to their simplicity of generation. However, the use of random code words places a severe burden on the communication equipment since the random nature of the code words does not admit to a simpler mathematical representation of the code words other than simple tabulation. Unlike all code word types used in practice, random codes have no inherent pattern that can be used to simplify the encoding and decoding apparatus; no formula or pattern exists for computing the code words for each message. Moreover, the decoding apparatus must be relatively complex since the code lengths required to correct errors in very noisy channels must be very large. For although only a small number of valid code words may exist in the code word set, the number of possible messages that could be received is equal to the total number of possible code words that exist for codes of a given length. Thus the transmitter must select by table lookup one of $2^S$ code words to encode one of $2^S$ message symbols, and the receiver must provide an apparatus for decoding one of $2^n$ possible receiver message patterns. Due to these factors the use of random encoding has been abandoned or unused by the art in favor of the use of highly structured code word sets that can be more easily generated and decoded.

Attempts to understand the functioning of the human brain have led to various "neural network" models in which large numbers of neurons are interconnected with the inputs to one neuron including the outputs of many other neurons. These models roughly presume each neuron exists in one of two states (quiescent and firing) with the neuron's state determined by the states of the input connected neurons (if enough connected neurons are firing, then the original neuron should be in the firing state); and the thrust of the models is to perform computations such as pattern recognition with the neural networks.

J. Hopfield, Neural Networks and Physical Systems with Emergent Collective Computational Abilities, 79 Proc. Natl. Acad. Sci. USA 2554 (1982) describes a neural network model with N neurons each of which has the value $-1$ or 1 (corresponding to the quiescent and firing states), so the state of the network is then a N-component vector $V=[V_1, V_2, \ldots, V_N]$ of $-1$'s and 1's which depends upon time. The neuron interconnections are described by a matrix $T_{i,j}$ defining the influence of the $j^{th}$ neuron on the $i^{th}$ neuron. The state of the network evolves in time as follows: for each i, the $i^{th}$ neuron has a fixed threshold $\theta_i$ and readjusts its state $V_i$ randomly in time by setting $V_i$ equal to $-1$ or 1 depending on whether $$\Sigma_j T_{i,j} V_j - \theta_i$$

is negative or positive. All neurons have the same average rate of readjustment, and the readjustments define a dynamical flow in state space. With the assumption that $T_{i,j}$ is symmetric, the potential function $$\Sigma_i \Sigma_j T_{i,j} V_i V_j$$

can be used to show that the flow of the network is to local minima of the potential function. Further, with a given set of s uncorrelated N-component binary $(-1, 1)$ vectors, $U^1, U^2, \ldots, U^s$, a $T_{i,j}$ can be defined by $$T_{i,j} = \sum_{1 \leq k \leq s} U_i^k U_j^k$$

and the corresponding network with the thresholds $\theta_j$ set equal to 0 has these $U^k$ as the fixed points of the flow and thus stable states of the network. Such a network can act as a content-addressable memory as follows: the memories to be stored in the network are used to construct the $U^k$ and hence $T_{i,j}$, so the stored memories are fixed points of the flow. Then a given partial memory is input by using it to define the initial state of the network, and the state will flow usually to the closest fixed point/stable state $U^k$ which is then the memory recalled upon input of the partial memory. This is the correlation used for decoding messages with the stable states corresponding to valid messages.

Figure 1:
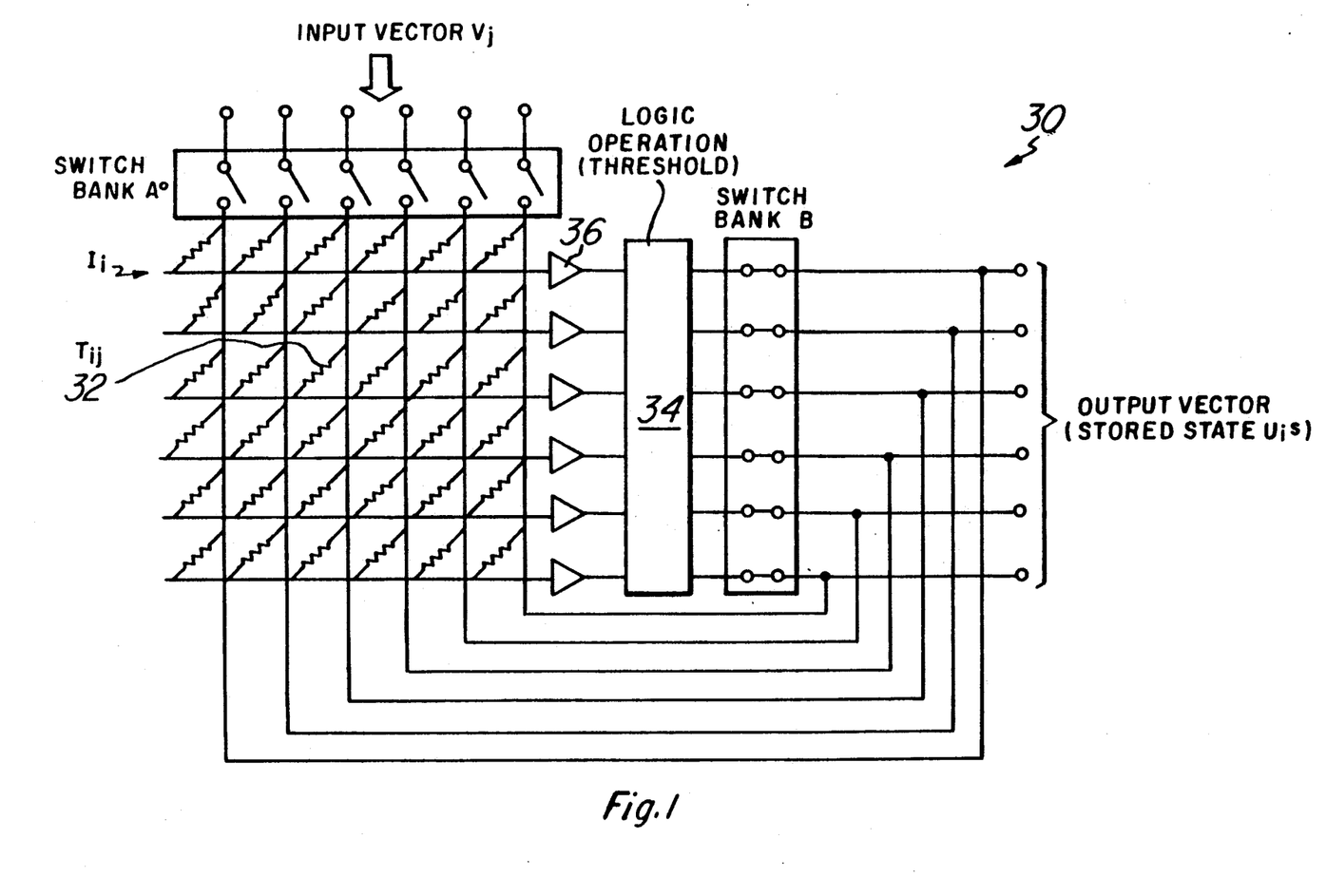
FIG. 1 is a schematic view of a neural network.

Further analysis and modified network models appear in, for example, J. Hopfield et al, Computing with Neural Circuits: A Model, 233 Science 625 (1986) and J. Hopfield, Neurons with Graded Response Have Collective Computational Properties like Those of Two-State Neurons, 81 Proc. Natl. Acad. Sci. USA 3088 (1984). FIG. 1 shows a simple neural network made from standard electronic components.

D. Ackley et al, A Learning Algorithm for Boltzmann Machines, 9 Cognitive Science 147 (1985) describe neural networks with additional adjustment mechanisms for the neurons which analogize thermal fluctuations; this permits escape from local minima of the potential function. However, this disrupts the flow to fixed points for memory recall of the Hopfield type neural networks.

SUMMARY OF THE INVENTION

The present invention provides systems and methods of error-controlled information transmission by use of a sequence of pairwise-maximally-separated vectors for encoding for transmission. The maximally-separated vectors may be generated by sequentially encoding vectors in a neural network and relaxing away from the encoded vectors to obtain the next vector in the sequence.

Alternative embodiments also provide a sequence of encoding vectors for a neural network that preserves closeness of input data.

This solves the problem of providing code books of code words for use in encoding and decoding information that is transferred over very noisy communication channels and closeness encoding for neural networks.

BRIEF DESCRIPTION OF THE DRAWINGS

The drawings are schematic for clarity.

FIGS. 4a–e compare preferred embodiment encoding with random encoding;

DESCRIPTION OF THE PREFERRED EMBODIMENTS

Figure 2:
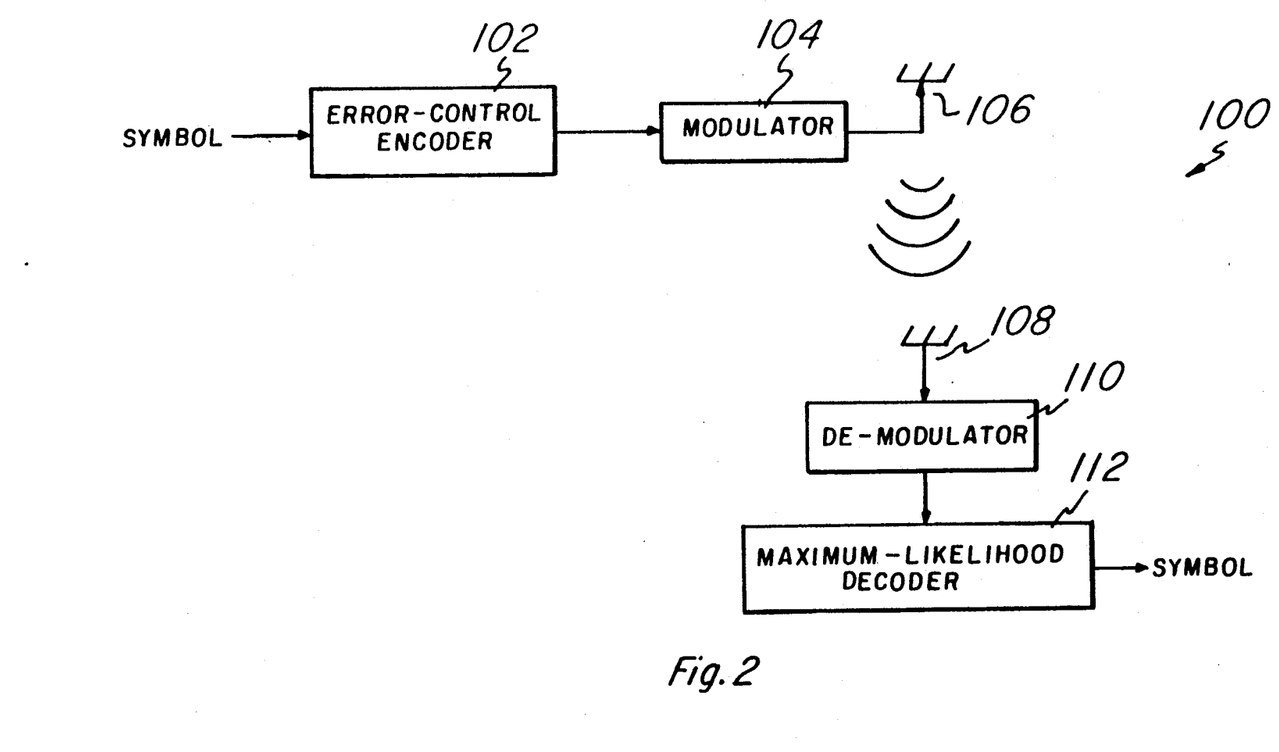
FIG. 2 is a block diagram of a transmission system.

FIG. 2 is a block diagram of a transmission system 100 that includes error correction. System 100 includes an encoder 102, modulator 104, transmitting antenna 106, receiving antenna 108, demodulator 110, and decoder 112; the communication channel is illustrated as a broadcast channel (modulator 104, spatially separated antennas 106 and 108, and demodulator 110) although other types of channels such as fiber optic, acoustic, and so forth may be used. System 102 operates by a message (consisting of a string of information symbols) being translated into code words by encoder 102, the code words being send through the communication channel (modulated, transmitted, received, demodulated), and the received distorted code words being decoded into a string of information symbols (received message) by decoder 112 which uses comparisons of the received distorted code words with the original code words to generate the string of information symbols. As described below, the particular encoder 102 and decoder 112 of system 100 provides efficient generation of code words for very noisy communication channels, and to provide a very fast method for decoding this information back into information symbols. The method successfully transforms source information into the redundant channel code bit sequences, and provides a way to invert rapidly that transformation in a manner that is not unduly complex.

In general, if t errors occur and if each code word is dissimilar from any other code word in its set by at least 2t+1 bits, then the error-control decoder will successfuly recover the original message by chosing the perfect code word that is most similar to the receiver code word. This is accomplished by performing a correlation between the receiver code word and all code words in the code word set.

A neural network correlator may be used to recover the actual received code word by finding the closest match of the received message to one of the known random code words. This is called "maximum likelihood decoding" or "minimum distance decoding". (It is assumed that the receiver and transmitter share the same set of code words.) The receiver simply computes the inner (dot) product of the received message with each of the valid message code words and selects as the apparent received code word the code word that has the maximum dot product with the received word. This correlation may be performed with a standard computer in software, by custom processing hardware such as systolic or sequential processors, or by neural network hardware. The correlation process works in parallel, has a speed of correlation independent of the size of the code book (number of possible messages) and directly provides the original message as well as a filtered code word.

For code decoding and correction, it is necessary first to associate a symbol list with random code words. This is accomplished by arranging a number of possible code words, known as a code word space 120, which is much larger than the number of possible symbols, known as a symbol space 122. For example, the code words could be 64-bit vectors and the symbols 5-bit vectors. This is heuristically illustrated in FIG. 3a. The encoded information is then transmitted through the communication channel to the receiver which matches the received distorted code word with a code word in space 120 and then associates that code word with the corresponding symbol in symbol space 122 as suggested in FIG. 3b.

The preferred embodiments are best described in the context of a specific well known neural network model. Consider a two-state threshold model of N neurons connected in a network, and presume each of the N neurons has two states: the output of the $j^{th}$ neuron is denoted $V_j$ and may only have the value $-1$ or 1. The $j^{th}$ neuron's output is connected to the $i^{th}$ neuron's input with a synaptic interconnection strength $T_{i,j}$, and the $i^{th}$ neuron may also have an external input $I_i$. Thus for each i the total input to the $i^{th}$ neuron is given by:

$$\sum_{1 \leq j \leq N} T_{i,j} V_j + I_i$$

Note that the term $T_{i,i}$ represents a self-stimulation of the $i^{th}$ neuron and that $T_{i,i}=0$ is traditionally presumed; however, this is not necessary in the following. For expositional simplicity, T will be presumed symmetric: $T_{i,j}=T_{j,i}$, although this does not affect the preferred embodiments.

Each of the N neurons is presumed to respond at random times to its then-current total input and adjust its output as follows:

$$V_i \rightarrow -1 \text{ if } \sum_j T_{i,j} V_j + I_i < \theta_i$$

$$V_i \rightarrow 1 \text{ if } \sum_j T_{i,j} V_j + I_i > \theta_i$$

where $\theta_i$ is a threshold for the $i^{th}$ neuron. These repeated responses of the outputs to the then-current inputs constitutes the dynamical evalution of the network of neurons and may be described as a flow in a state space. More specifically, define a state of the network at time t as an N-component vector V with its $i^{th}$ component equal to the output of the $i^{th}$ neuron ($V_i$) at time t. In other words, V is a vector of $-1$'s and 1's. (The dependence of V on t is suppressed for clarity.) Thus the state space is isomorphic to the vertices of a hypercube in N-dimensional euclidean space, and each dynamical change of a $V_i$ translates into a change from the state corresponding to one vertex to the state corresponding to a second vertex connected by an edge to the first vertex.

The dynamical flow can be described by a potential (Liapunov) function as follows: define $$E(V) = -\frac{1}{2} \sum_{i,j} T_{i,j} V_i V_j - \sum_j V_j(I_j - \theta_j)$$

Note that the time dependence of V has been suppressed. A change in a component of V, say $V_k$, is denoted by $\Delta V_k$ and implies a change in E equal to $$\Delta E(V) = -\left(\sum_j T_{k,j} V_j + I_k - \theta_k\right) \Delta V_k.$$

$V_k$ can only change from $-1$ to 1 or from 1 to $-1$, so $\Delta V_k$ is either $+1$ or $-1$, and the rule for $V_k$ changes implies that $\Delta E$ is always negative because the term in the parentheses is negative for $V_k$ changing from 1 to $-1$ and positive for $V_k$ changing from $-1$ to 1. Thus E is monotonically decreasing during the dynamical flow, and the fixed points are states that are local minima of E. Of course, the state space is discrete and finite, so the dynamical flow is a finite sequence of jumps.

The neural network behaves as an associative memory when the dynamical flow in state space has fixed points which attract nearby states. As illustrated by example in the following, a fixed point corresponds to a particular memory stored in the network, and nearby states contain partial information about that memory; so initializing the network (inputting initial values for the neurons) at a state nearby a particular fixed point state will recall the memory corresponding to that fixed point state by the dynamical flow. For example, if $U^1$, $U^2, \ldots, U^s$ are binary N-dimensional vectors which are fixed points for the dynamical flow and correspond to stored memories of images 1,2, ... ,s, and if V is an N-dimensional vector corresponding to an observed image, then inputting V to be the initial state of the network and letting the network dynamically evolve will result in the state of the network becoming fixed at a certain $U^k$ which is the "closest" of the fixed points to V; and image k has been recalled by the network upon input of the observed image. Note that "close" in the state space is typically measured by Hamming distance: if V and W are two N-dimensional vectors of $-1$'s and 1's, then the Hamming distance from V to W equals N' where V and W have N' components differing and the remaining N$-$N' components equal.

The interconnection strengths $T_{i,j}$ determine the fixed points in state space, and a possible recipe for defining a $T_{i,j}$ to store a given set of memories is as follows: if states $U^1, U^2, \ldots, U^s$ are to be stored (so each $U^k$ is an N-dimensional vector of $-1$'s and 1's), then set $$T_{i,j} = \sum_{1 \leq k \leq s} U_i^k U_j^k.$$

This definition of $T_{i,j}$ implies the $U^k$ are the fixed points if the $U^k$ are orthogonal ($<U^k/U^m>=0$).

FIG. 1 schematically illustrates a possible neural network fabricated from standard electronic components. The network, generally denoted by the reference numeral 30, includes rows and columns of wires interconnected by an array of transconductances $T_{i,j}$ 32, the horizontal wires connect to buffers 36 and threshold linear array 34 and switch blank B. The neuron states correspond to voltages on the vertical wires and the connecting righthand portions of the horizontal wires. Switch bank A (with switch bank B open) is used to input the initial network state, and the buffers 36 may incorporate the random adjustment timing. If inputs $I_i$ are needed, they are entered at the lefthand ends of the horizontal wires.

Figure 3A:
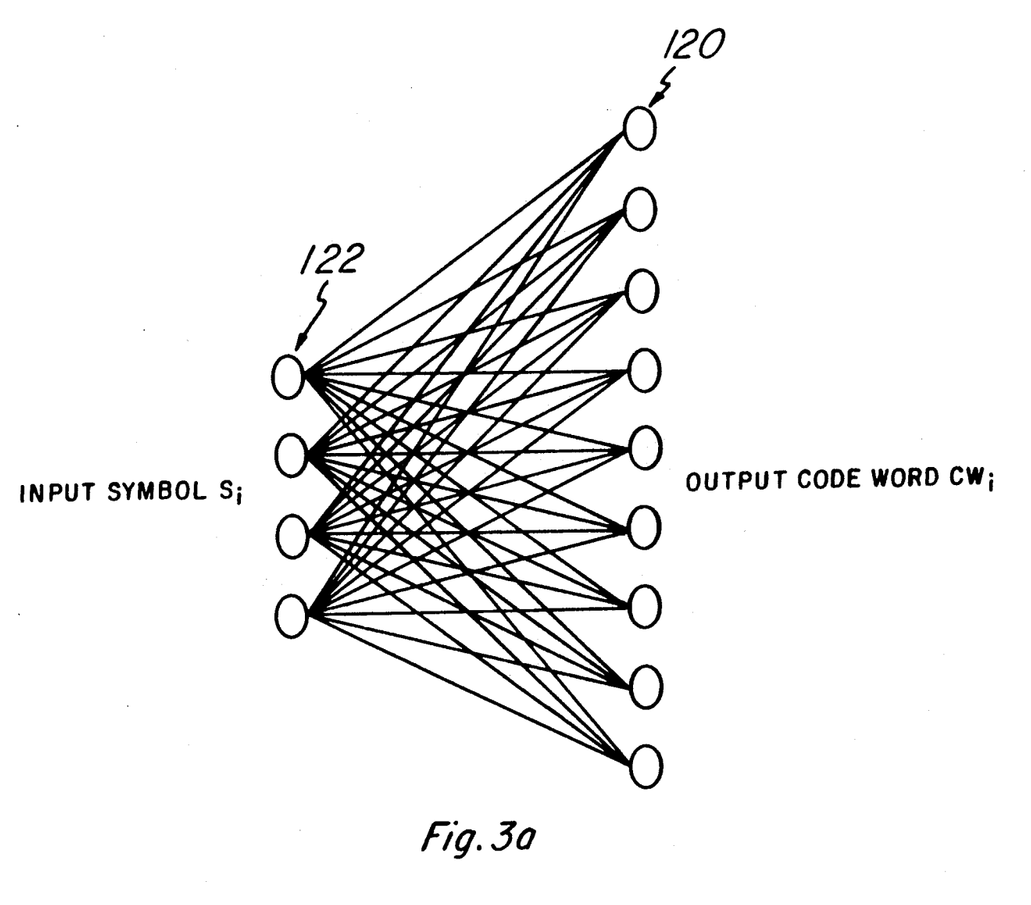
FIGS. 3a–b illustrate symbol-code word association.

The feed forward neural network of FIG. 3a is composed of a set of input neurons $N_{input}$ and a set of output neurons $N_{output}$ where the output of each of the set of input neurons is connected to the input of each of the set of output neurons via an interconnection strength of weight $T_{ij}$, where $T_{ij}$ is the connection strength that couples the jth input neuron to the ith output neuron. The existence of the connection weights is implied in FIG. 3a by the existence of a line between each input neuron and each output neuron. The state of each output neuron is determined by the following function:

$$N_{output,i} = 1 \text{ IF } \sum_{allj} T_{ij}N_{input,j} \geq \Theta_i$$

$$N_{output,i} = -1 \text{ IF } \sum_{allj} T_{ij}N_{input,j} < \Theta_i$$

with $N_{input,j} \epsilon(1,-1)$

The connection weights are assigned values so that a given pattern of neuron states across the set of input neurons will cause the pattern of neuron states across the output neurons to match a desired pattern. In particular, the connection strengths $T_{ij}$ can be adjusted using a conventional neural network training algorithm, such as Back Propagation, to cause the state of the output neurons to match one of a set of patterns $O_k$, when the input neurons are forced to match a pattern $I_k$ in one-to-one fashion. The neural network of FIG. 3a can, thus, be used to encode a set of symbols $I_k$ into a set of code words $O_k$ after conventional training.

Figure 3B:
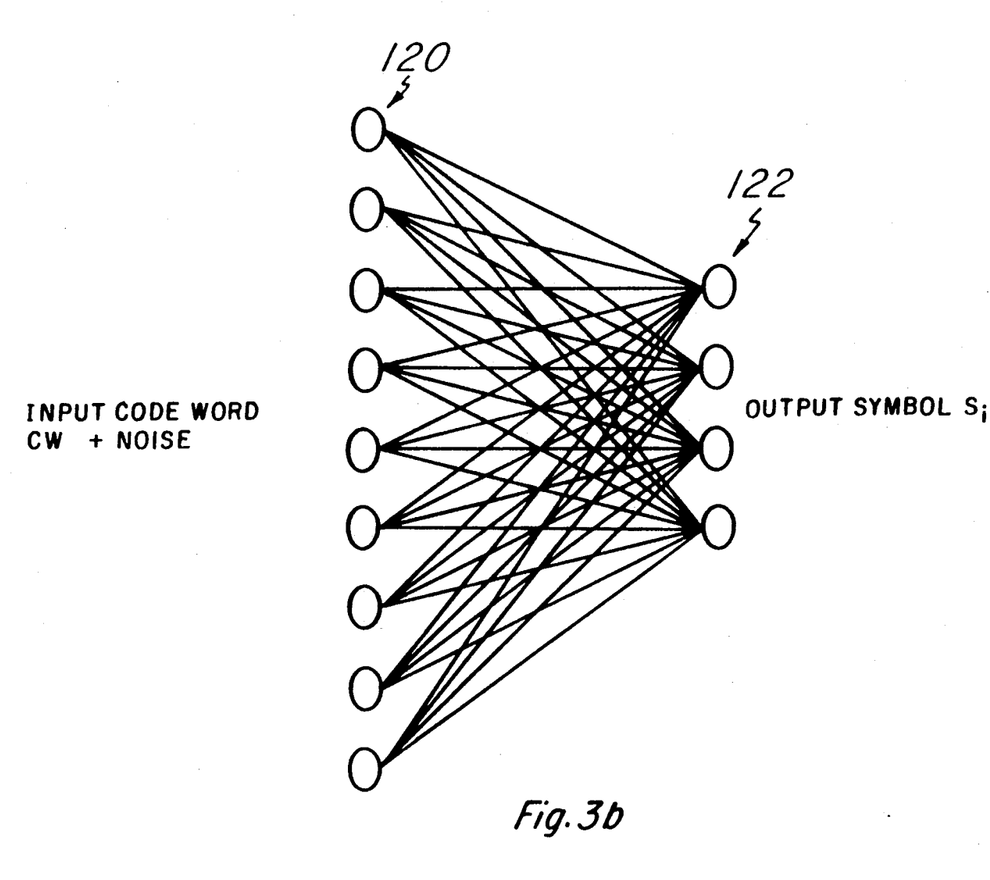

The feed forward neural network of FIG. 3b is composed of a set of input neurons $N_{input}$ and a set of output neurons $N_{output}$, where the output of each of the set of input neurons is connected to the input of each of the set of output neurons via an interconnection strength or weight $T_{ij}$, where $T_{ij}$ is the connection strength that couples the jth input neuron to the ith output neuron. The existence of the connection weights is implied in FIG. 3b by the existence of a line between each input neuron and each output neuron. The state of each output neuron is determined by the following function:

$$N_{output,i} = 1 \text{ IF } \sum_{allj} T_{ij}N_{input,j} \geq \Theta_i$$

$$N_{output,i} = -1 \text{ IF } \sum_{allj} T_{ij}N_{input,j} < \Theta_i$$

with $N_{input,j} \epsilon(1,-1)$

Similarly, the connection strengths that couple a set of input neurons to output neurons as shown in FIG. 3b, can be trained using conventional neural networks methods such as Back Propagation to cause the state of the output neurons to match one of a set of patterns $I_k$, when the input neurons are forced to match a pattern $O_k$ in one-to-one fashion. The neural network of FIG. 3b can be used to decode a set of input code words $O_k$ into a set of symbols $I_k$ after conventional training.

In addition, if the two neural networks in FIGS. 3a and 3b can be constructed, so that the neural network in FIG. 3a provides the encoding of a set of symbol $I_k$ into a set of codewords $O_k$, and the neural network in FIG. 3b provides a decoding of the same set of codewords $O_k$ back into the original set of symbols $I_k$. This can be accomplished by using N and M neurons in the respective input and output layer of the network of FIG. 3a, while using M and N neurons in the respective input and output layer of the network of FIG. 3b and by setting each of the interconnection strengths $T_{ij}$ of the network of FIG. 3b. Thus, an encoder-decoder circuit can be formed by making the network of FIG. 3b the physical and electrical dual, or transpose, of the network in FIG. 3a.

The first preferred embodiment code generation also uses relaxation of a neural network to stable states, but uses a "reverse" dynamical flow to find stable states away from previously determined vectors. In particular, with $U^1, U^2, U^3, \ldots, U^n$ already found and stored in the network, $U^{n+1}$ is found as a stable state of a reverse relaxation away from the already-stored vectors and then $U^{n+1}$ is stored in the network. The process is repeated to generate a sequence of pairwise-not-close vectors which then may be used as error correction codes words.

First preferred embodiment method of generation of a sequence $U^1, U^2, U^3, \ldots, U^8$ of N-component binary vectors which are pairwise not close by use of an N-neuron neural network includes the following steps:

(a) Begin with a symmetric N-neuron neural network with interconnection strengths $T_{i,j}{}^0=0$ but with the following "reverse" dynamics:

$$V_i \rightarrow 1 \text{ if } \sum_j T_{i,j}^0 V_j < \theta_i$$

$$V_i \rightarrow 0 \text{ if } \sum_j T_{i,j}^0 V_j > \theta_i$$

Thus the flow is contrary to that previously described and away from any stored vectors.

(b) Pick a random N-component binary vector $U^1$; this will be the first vector of the generated sequence of code words.

(c) Store $U^1$ in an auxiliary memory (code word list or code book) and in the neural network by updating the interconnection strengths:

$$T_{i,j}{}^1 = T_{i,j}{}^0 + U_i{}^1 U_j{}^1$$

However, set $T_{i,i}{}^1 = 0$.

(d) Input $U^1$ as the initial conditions, and let the network evolve to a stable state. Set $U^2$ equal to this stable state.

(e) Store $U^2$ in the code book and in the network by updating the interconnection strengths:

$$T_{i,j}{}^2 = T_{i,j}{}^1 + U_i{}^2 U_j{}^2$$

Again set $T_{i,i}{}^2 = 0$. Note that this is just step (c) but with the new vector $U^2$ and the new interconnection strengths $T_{i,j}{}^2$.

(f) Input $U^2$ as the initial conditions, and let the network evolve to a stable state. Set $U^3$ equal to this stable state. Note that this is just step (d) but with the new interconnection strengths and leads to the new vector $U^3$.

(g) Repeat the steps of storing the newest vector and evolving with the newest vector as initial conditions to generate the next vector until the sequence of vectors $U^1, U^2, U^3, \ldots, U^8$ has been generated.

Figure 4B:
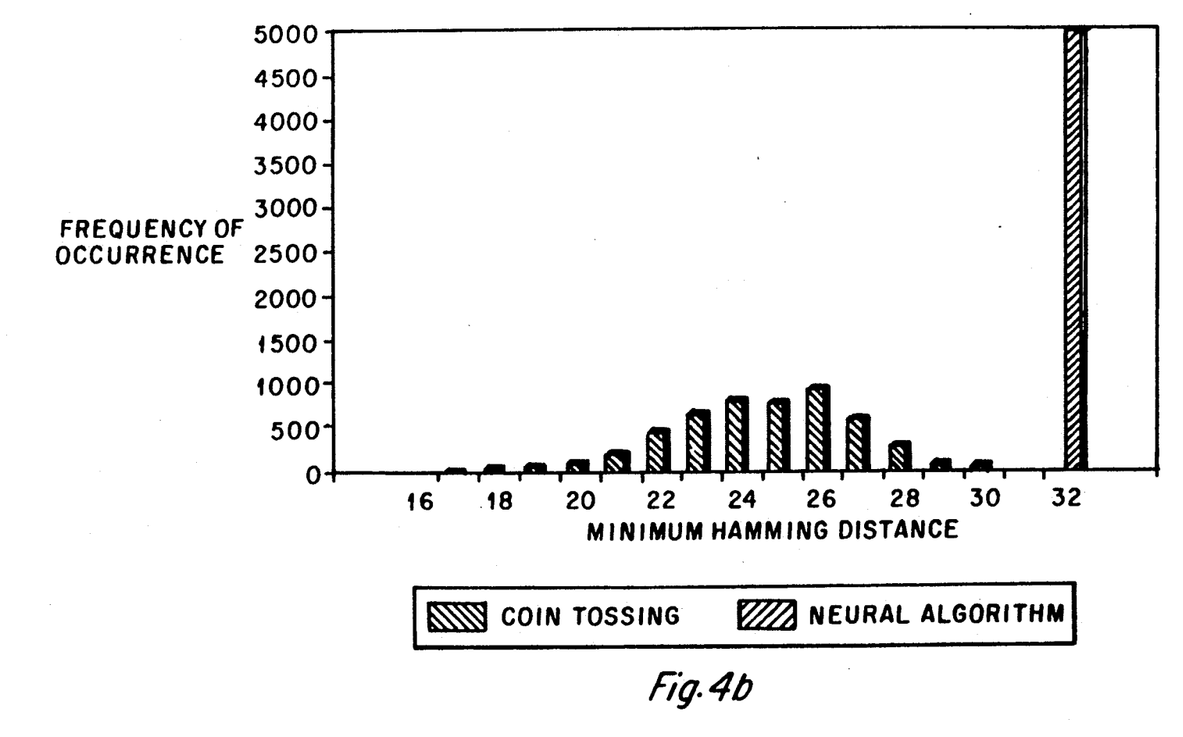
Figure 4C:
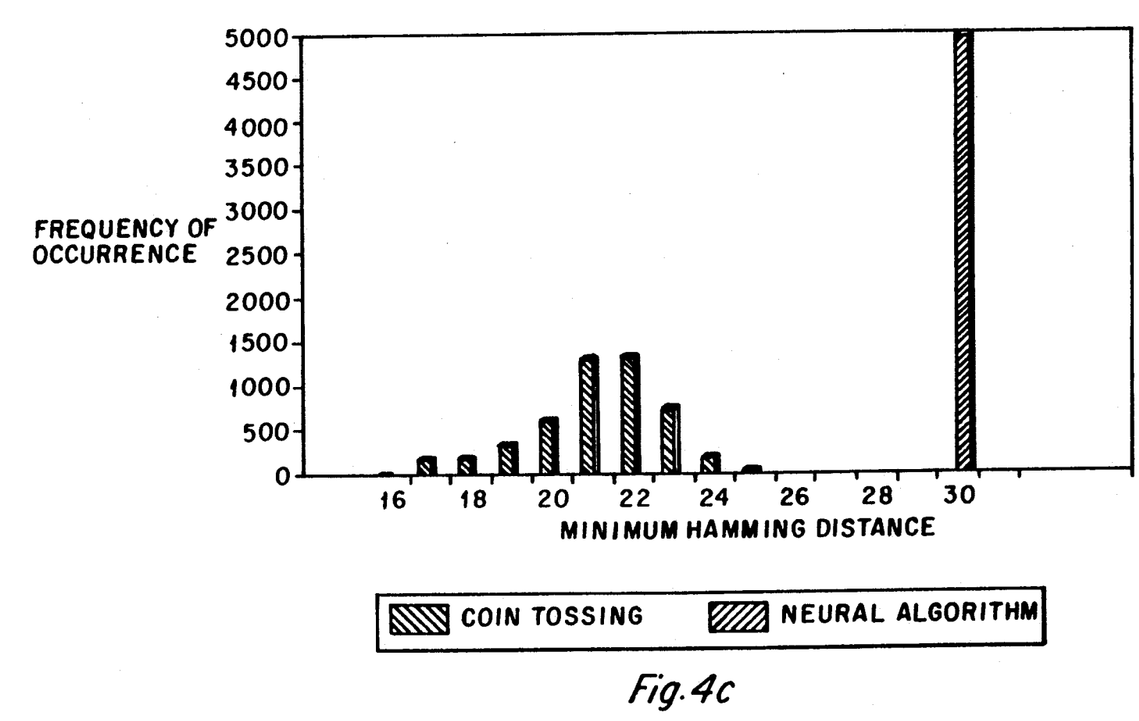
Figure 4D:
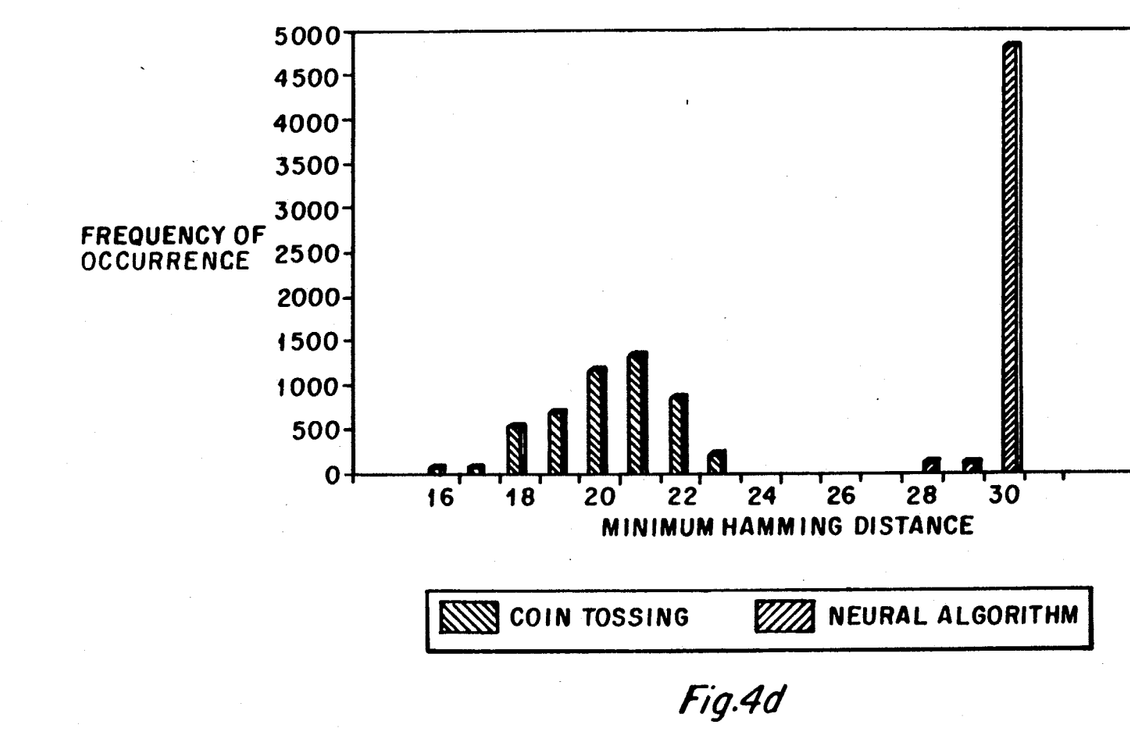

Because the sequence of vectors $U^1, U^2, U^3, \ldots, U^8$ was generated by the neural network as a sequence of stable points of "reverse" flows, each of the vectors is far away from the others. Simulations of the first preferred embodiment method showed that the first preferred embodiment code vectors were far superior to code vectors obtained by random choices; see FIGS. 4a–e which show the minimum Hamming distance between code words in a code book for a sampling of 5,000 code books for various size words and books. In particular, FIG. 4a shows the first preferred embodiment (denoted "Neural Algorithm" in the Figure) generated two 64-bit code words that were separated by a Hamming distance of 32 (the maximum possible with two 64-bit words) in all 5,000 of the simulations. conversely, use of two random (denoted "Coin Tossing") 64-bit words yielded separations of Hamming distance varying from 32 down to 18. As the number of code words is increased to four the first preferred embodiment stills provides separation between code words of 32, but the random code words have smaller minimum separation; see FIG. 4b. Similarly, FIGS. 4c and 4d illustrate the changes as the number of code words is increased to eight and sixteen, respectively.

Figure 4E:
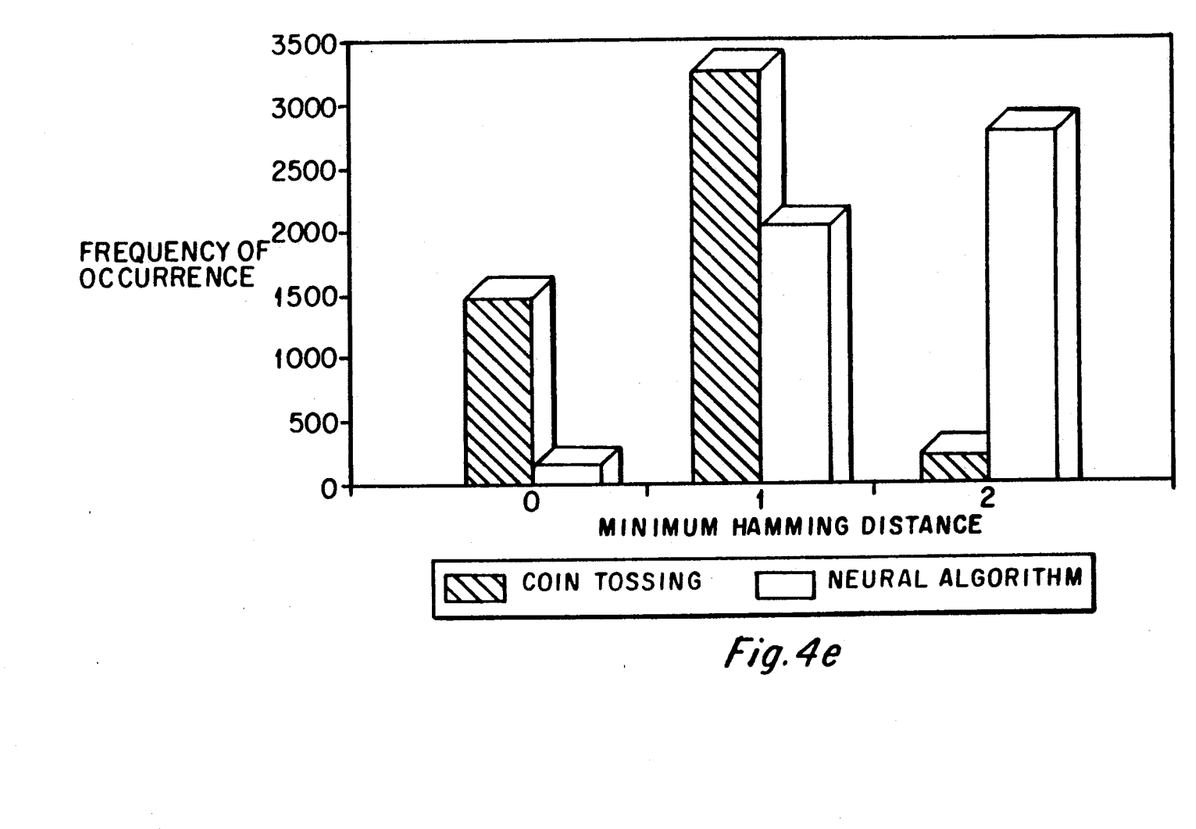

FIG. 4e shows an extreme case of only 16-bit words and 64 code words. Note that the randomly-selected code words have two or more code words coinciding in about 30% of the simulations, whereas the first preferred embodiment only had coincident code words in about 3% of the simulations; conversely, the random code words were separated by a Hamming distance of at least 2 in only about 5% of simulations, but the first preferred embodiment had a minimum separation of at least 2 in more than 50% of the simulations.

The vectors $U^1, U^2, \ldots, U^3$ form the code book, and each information symbol to be used is associated with one of the words $U^j$ of the code book (e.g., $S^j$ is associated with $U^j$). This association just forms a lookup table; typically the number of symbols is small, so the lookup table is not overly cumbersome. Alternatively, a neural network could be trained (e.g., by back propagation) to perform this association.

Decoder 112 may use standard electronic hardware to implement a maximum likelihood detection of the received distorted code word or decoder 112 may also use neural network computations. In particular, each received distorted code word is input to a neural network that has the code book words $U^1, U^2, \ldots, U^8$ stored, and the neural network forward relaxes to pick out the closest code word $U^k$. Thus the neural network used in this part of decoder 112 may be identical to the neural network used to generate the code book.

Figure 5:
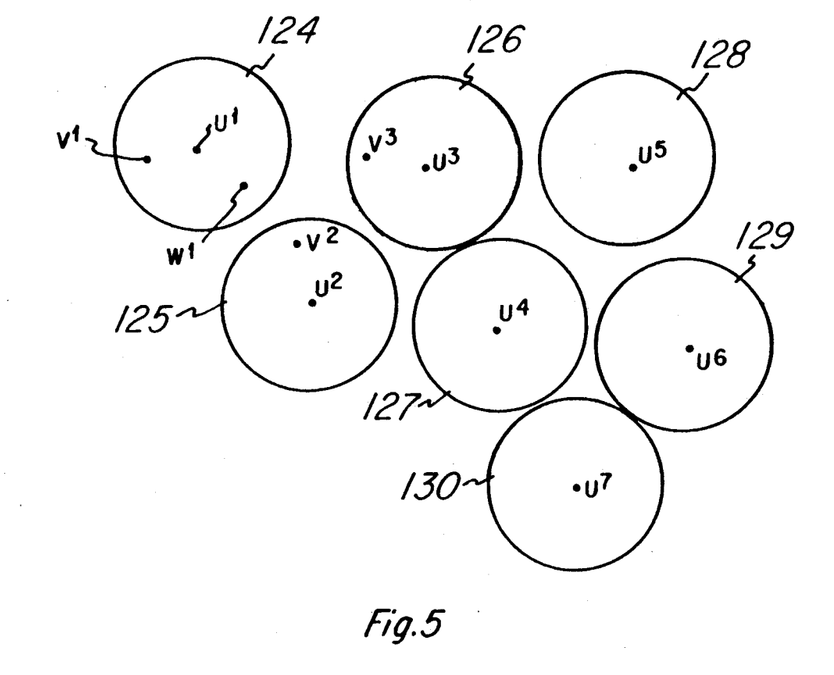
FIG. 5 illustrates code words.

FIG. 5 schematically illustrates a number of hyperspheres 124–130 encircling states of the system, designated by $U^1, U^2, \ldots$ etc. Each circle or hypersphere connotes a code word neighborhood in which a distorted code word (e.g., $V^1$ or $W^1$ represent distortions of $U^1$) can lie, and when the system is relaxed, the tendency is toward the center thereof where the exact code word is located. With maximally spaced code words, and when one can unambiguously associate any received data word with a unique code word, the relaxation of the system yields the correct code word. As described below, it is also possible to use the correlation machine concept to convert the "best guess" code word directly into the symbol by forming a correlation matrix with the symbol-code word pairs themselves. As a result, a two step process of "best guessing", followed by a code word to symbol table look-up operation will recover the actual symbol initially encoded.

Where there is a substantial chance of significant errors which can perturbate the message, the receiver must maintain a "code book" of all possible incoming data words in order to know which ideal code is closest to the received word. In actual practice using conventional techniques, such a look-up table of code words is not practical, as the code word space is much too large. However, the correlation memory can perform a mapping of all message space back into a few code words in real time. As a result, the neural network correlator is very advantageous as a real time message filter, especially in high channel noise environments.

The code word $U^j$ found may then be associated with its information symbol by a lookup table (but the code word space may very large), a standard decoder, or by another neural network which has the information symbols (in binary format) stored and uses forward relaxation to pick out the symbol. In particular, if the code words are N bits long (typically 64 bits) and the information symbols are M bits long (typically 5 bits) with $N >> M$, then an $N+M$ neuron neural network with stored vectors having components 1 through N equal to the components of a code word and components $N+1$ through $N+M$ equal to the components of the associated symbol may be used to do the association as follows. Because the code words have many more bits than the symbols and because the code words are highly separated, when a vector with components 1 through N equal to a code word and components $N+1$ through $N+M$ randomly picked is input to the network, the network will forward relax to the stored vector with the same components 1 through N and the associated symbol for components $N+1$ through $N+M$. Thus this provides the association from code word to symbol simply by reading components $N+1$ through $N+M$.

Second preferred embodiment method of code generation is similar to the first preferred embodiment except that rather than following a reverse relaxation of a neural network from a starting vector $W^1$ to a highly separated next code word, the reverse relaxation is stopped while the network state $W^2$ is still close to the starting code word $W^1$. A sequence of code words $W^1, W^2, \ldots, W^8$ is generated recursively, and the code words have the property that $W^j$ and $W^{j+n}$ are separated by a Hamming distance that for small n is small and increases with n. This sequence of code words can be used for encoding information for input into a neural network; any closeness in the input information may be preserved by associating with adjacent code words. Note that the degree of closeness may be adjusted simply by adjusting the number of neurons changing state before stopping the reverse relaxation. Of course, the number of neurons changing state prior to stopping need not be constant, but may be randomly varied about a mean or follow some other rule.

MODIFICATIONS AND ADVANTAGES

Figure 6:
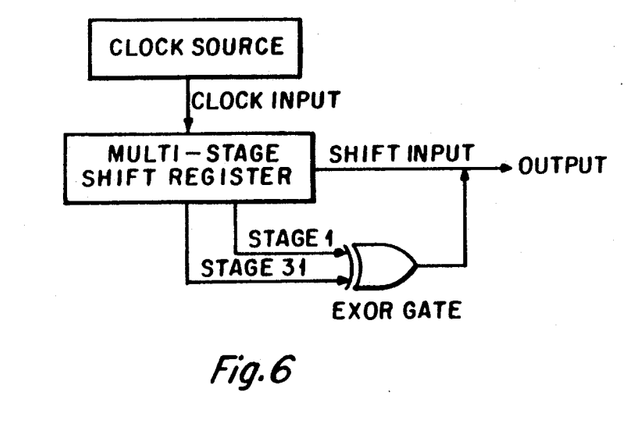
FIG. 6 shows a pseudo-random number generator.

The first preferred embodiment code generation and communication system may also be used for transmission of encrypted messages. Further, the code book may be regenerated during a single transmission to change the code on the fly and avoid deciphering. This may be accomplished by including in both the encoder 102 and the decoder 112 identical neural networks; that is, if the starting vector $U^1$ is known to both encoder 102 and decoder 112, then the generated sequences $U^2, U^3, \ldots, U^8$ are identical. Hence, the code book may be changed periodically by encoder 102 selecting a new random starting vector and transmitting it to decoder 112 for a new code book generation. Note that if communication channel noise is also a problem, then one of the vectors of the old code book could be transmitted and used to start the new code book. Identical neural networks can be achieved by using simulations, rather than neural network hardware, with pseudo-random number generators driving the simulations (determining which neuron changes state next). FIG. 6 shows a pseudo-random number generator that could be used. Thus if encoder 102 and decoder 112 have the same pseufo-random number generator, then simulations will be identical.

Indeed, the starting code word could also be used as the seed for the pseudo-random number generator.

What is claimed is:

1. A method for generating a sequence of K N-bit binary code words for information transmission encoding and decoding, comprising the steps of:
   (a) providing a neural network with N neurons, each neuron has two states with output values 0 and 1, interconnection strengths $T_{ij}$ connecting the output of the jth neuron to an input of the ith neuron, and dynamical evolution given by $V_i \rightarrow 1$ if $\Sigma_j T_{ij} V_j < \theta_i$ and $V_i \rightarrow 0$ if $\Sigma_j T_{ij} V_j > \theta_i$ where $V_i$ is the output value of the ith neuron, $V_j$ is the output value of the jth neuron and $\theta$ is a threshold;
   (b) providing an initial N-bit binary code word $U^1$ with components $U^1_j$;
   (c) setting said interconnection strengths $T_{ij} = U^1_i U^1_j$ for all i and j except setting $T_{ii} = 0$;
   (d) inputting $U^1$ into said neural network, and letting said neural network evolve to a stable state V;
   (e) taking said stable state V to define a new binary code word $U^2$;
   (f) updating said interconnection strengths by adding $U^2_i U^2_j$ to the current $T_{ij}$ for all i and j except i=j;
   (g) repeating steps (d)-(f) with $U^k$ replaced by $U^{k+1}$ for $k=1,2,\ldots,K-1$; and
   (h) applying said code words $U^1, U^2, \ldots U^k$ to establish an information transmission encoder and decoder.

2. The method of claim 1, wherein:
   (a) said providing an initial N-bit binary code word $U^1$ is by random selection.

3. A method for generating a sequence of K N-bit binary code words for information transmission encoding and decoding, comprising the steps of:
   (a) providing a Hopfield neural network with N neurons but with dynamical evolution away from stored states defining the interconnection strengths;
   (b) providing an initial N-bit binary code word $U^1$;
   (c) setting the interconnection strengths of said neural network $T_{ij} = U^1_i U^1_j$ for all i and j except setting $T_{ii} = 0$;
   (d) inputting $U^1$ into said neural network, and letting said neural network evolve to a stable state V;
   (e) taking said stable state V to define a new binary code word $U^2$;
   (f) updating said interconnection strengths by adding $U^2_i U^2_j$ to the current $T_{ij}$ for all i and j except i=j;
   (g) repeating steps (d)-(f) with $U^k$ replaced by $U^{k+1}$ for $k=1, 2, \ldots, K-1$; and
   (h) applying said code words $U^1, U^2, \ldots U^k$ to establish an information transmission encoder and decoder.

4. The method of claim 3, wherein:
   (a) said providing an initial N-bit binary code word $U^1$ is by random selection.

* * * * *